United States Patent
Arya et al.

(10) Patent No.: US 10,269,932 B1
(45) Date of Patent: Apr. 23, 2019

(54) ASYMMETRIC FORMATION OF EPI SEMICONDUCTOR MATERIAL IN SOURCE/DRAIN REGIONS OF FINFET DEVICES

(71) Applicant: GLOBALFOUNDRIES Inc., Grand Cayman (KY)

(72) Inventors: Ankur Arya, Saratoga Springs, NY (US); Brian Greene, Saratoga Springs, NY (US); Qun Gao, Clifton Park, NY (US); Christopher Nassar, Ballston Spa, NY (US); Junsic Hong, Malta, NY (US); Vishal Chhabra, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/874,341

(22) Filed: Jan. 18, 2018

(51) Int. Cl.
| | |
|---|---|
| *H01L 27/01* | (2006.01) |
| *H01L 29/66* | (2006.01) |
| *H01L 21/8234* | (2006.01) |
| *H01L 29/78* | (2006.01) |
| *H01L 29/06* | (2006.01) |
| *H01L 29/08* | (2006.01) |

(52) U.S. Cl.
CPC .. *H01L 29/6656* (2013.01); *H01L 21/823418* (2013.01); *H01L 21/823431* (2013.01); *H01L 29/0653* (2013.01); *H01L 29/0847* (2013.01); *H01L 29/6653* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 9,123,744 B1 | 9/2015 | Liao et al. | |
| 9,159,630 B1 | 10/2015 | Wei et al. | |
| 9,553,166 B1 * | 1/2017 | Cheng | H01L 29/66553 |
| 9,887,094 B1 | 2/2018 | Qi et al. | |
| 2013/0270652 A1 * | 10/2013 | Liaw | H01L 27/1104 257/401 |
| 2015/0076610 A1 * | 3/2015 | Ito | H01L 29/785 257/365 |
| 2016/0064372 A1 * | 3/2016 | Singh | H01L 27/088 257/355 |
| 2016/0315146 A1 * | 10/2016 | Jung | H01L 29/0847 |
| 2016/0315172 A1 * | 10/2016 | Wu | H01L 29/0847 |
| 2017/0098648 A1 * | 4/2017 | Lee | H01L 21/823431 |
| 2017/0345933 A1 * | 11/2017 | Fung | H01L 21/02532 |
| 2018/0151439 A1 * | 5/2018 | Huang | H01L 21/823418 |

\* cited by examiner

*Primary Examiner* — Kevin M Picardat
(74) *Attorney, Agent, or Firm* — Amerson Law Firm, PLLC

(57) ABSTRACT

One illustrative method disclosed herein includes, among other things, forming a first fin having first and second opposing sidewalls and forming a first sidewall spacer positioned adjacent the first sidewall and a second sidewall spacer positioned adjacent the second sidewall, wherein the first sidewall spacer has a greater height than the second sidewall spacer. In this example, the method further includes forming epitaxial semiconductor material on the fin and above the first and second sidewall spacers.

17 Claims, 7 Drawing Sheets

US 10,269,932 B1

ASYMMETRIC FORMATION OF EPI SEMICONDUCTOR MATERIAL IN SOURCE/DRAIN REGIONS OF FINFET DEVICES

BACKGROUND OF THE INVENTION

1. Field of the Invention

The present disclosure generally relates to the fabrication of integrated circuits, and, more particularly, to various novel methods related to the asymmetric formation of epi semiconductor material in source/drain regions of FinFET devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc.

A conventional FET is a planar device wherein the entire channel region of the device is formed parallel and slightly below the planar upper surface of the semiconducting substrate. In contrast to a planar FET, there are so-called 3D devices, such as an illustrative FinFET device, which is a three-dimensional structure. FIG. 1 is a perspective view of an illustrative prior art FinFET semiconductor device 10 that is formed above a semiconductor substrate 12 wherein the fins 14 of the device 10 are made of the material of the substrate 12, e.g., silicon. The device 10 includes a plurality of fin-formation trenches 13, three illustrative fins 14, a gate structure 16, a sidewall spacer 18 and a gate cap layer 20. The spacer 18 is typically made of silicon nitride, but in some cases it may be made of a material having a lower dielectric constant (k) than that of silicon nitride. An insulating material 17, e.g., silicon dioxide, provides electrical isolation between the fins 14. The fins 14 have a three dimensional configuration: a height H, a width W and an axial length L. The axial length L corresponds to the gate length of the device, i.e., the direction of current travel in the device 10 when it is operational. The gate width of the device 10 is orthogonal to the gate length direction. The portions of the fins 14 covered by the gate structure 16 are the channel regions of the FinFET device 10. The portions of the fins 14 that are positioned outside of the spacers 18 will become part of the source/drain regions of the device 10.

Typically, after the formation of the gate structure 16 and the spacer 18, an epitaxial growth process will be performed to form additional epitaxial semiconductor material on the exposed portions of the fins 14 in the source/drain regions of the device 10 using the fins 14 as a growth surface. The additional epi semiconductor material is formed to reduce the electrical resistance of the source/drain region and to provide a physically larger contact structure, thereby making it easier to land a conductive contact structure on the source/drain region. There is a constant drive to increase the packing density of transistor devices, including FinFET devices, on modern integrated circuit (IC) products so as to ultimately reduce the size of consumer products, such as mobile phones or laptops that incorporate such IC products.

The present disclosure is directed to various novel methods related to the asymmetric formation of epi semiconductor material in source/drain regions of FinFET devices.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods related to the asymmetric formation of epi semiconductor material in source/drain regions of FinFET devices. One illustrative method disclosed herein includes, among other things, forming a first fin having first and second opposing sidewalls and forming a first sidewall spacer positioned adjacent the first sidewall and a second sidewall spacer positioned adjacent the second sidewall, wherein the first sidewall spacer has a greater height than the second sidewall spacer. In this example, the method further includes forming epitaxial semiconductor material on at least the fin and above the first and second sidewall spacers.

Another illustrative method disclosed herein includes, among other things, forming a plurality of fins for a FinFET device, each of the plurality of fins comprising first and second opposing sidewalls, and the plurality of fins comprising first and second outermost fins. In this example, the method also includes, for each of the first and second outermost fins, forming a first sidewall spacer adjacent the first sidewall and a second sidewall spacer adjacent the second sidewall, wherein the first sidewall spacer has a greater height than the second sidewall spacer. In this embodiment, the method also includes forming an epitaxial semiconductor material on at least each of the first and second outermost fins and above at least the first and second sidewall spacers on each of the first and second outermost fins.

One illustrative FinFET device disclosed herein includes a first fin having first and second opposing sidewalls, a first sidewall spacer positioned adjacent the first sidewall and a second sidewall spacer positioned adjacent the second sidewall, wherein the first sidewall spacer has a greater height than the second sidewall spacer. In this example, the device also includes an epitaxial semiconductor material positioned on at least the fin and above at least the first and second sidewall spacers.

BRIEF DESCRIPTION OF THE DRAWINGS

The disclosure may be understood by reference to the following description taken in conjunction with the accompanying drawings, in which like reference numerals identify like elements, and in which.

Figure 1:
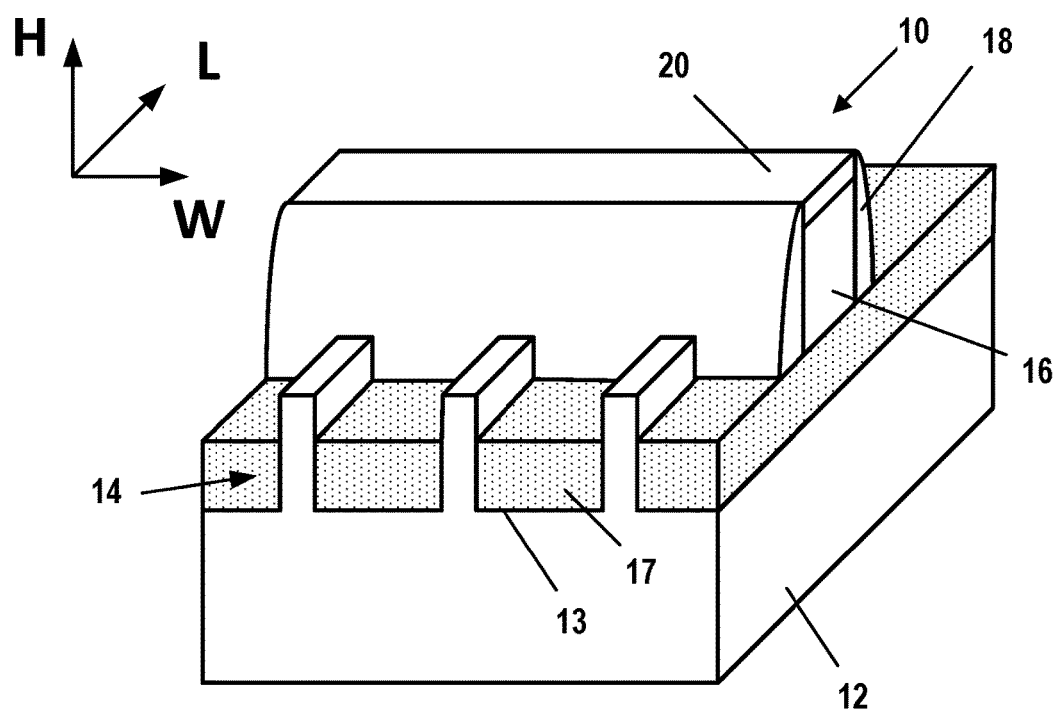
FIG. 1 is a simplistic depiction of an illustrative prior art FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various novel methods related to the asymmetric formation of epi semiconductor material in source/drain regions of FinFET devices. As will be readily apparent to those skilled in the art upon a complete reading of the present application, the present method is applicable to a variety of products, including, but not limited to, logic products, memory products, etc. With reference to the attached figures, various illustrative embodiments of the methods and devices disclosed herein will now be described in more detail.

Figure 2:
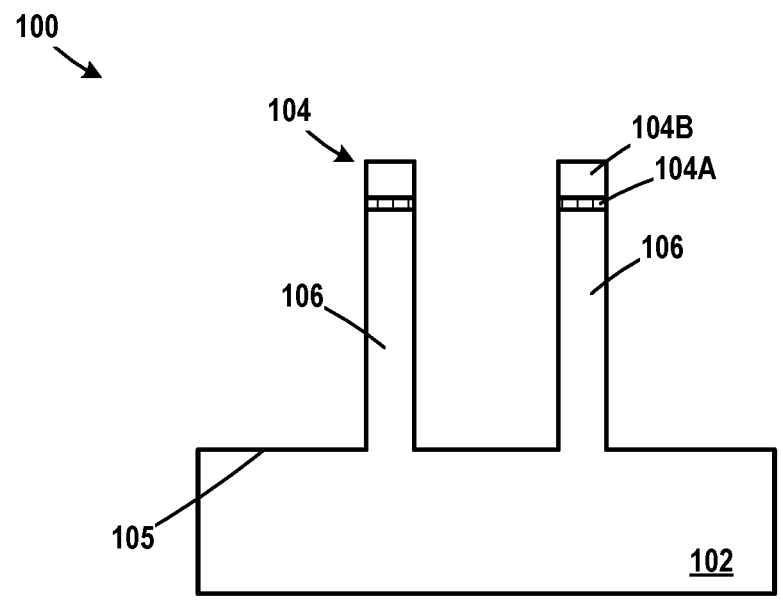
FIGS. 2-12 depict various novel methods disclosed herein related to the asymmetric formation of epi semiconductor material in source/drain regions of FinFET devices.

FIG. 2 depicts a FinFET device 100 that is formed in and above a semiconductor substrate 102. The substrate 102 may have a variety of configurations, such as the bulk substrate configuration depicted herein or a semiconductor-on-insulator (SOI) configuration. Such an SOI substrate includes a bulk semiconductor layer, a buried insulation layer positioned on the bulk semiconductor layer and an active semiconductor layer positioned on the buried insulation layer, wherein the devices disclosed herein are formed in and above the active layer. The active layer and/or the bulk semiconductor layer may be made of silicon or they may be made of semiconductor materials other than silicon, and they both do not have to be made of the same semiconductor material. Thus, the terms "substrate" or "semiconductor substrate" should be understood to cover all semiconducting materials and all forms of such materials.

FIG. 2 is a cross-sectional view of the FinFET device 100 that is taken through one of the source/drain regions of the device 100 in a direction corresponding to the gate width direction of the device 100. FIG. 2 depicts the device at a point in fabrication wherein various process operations will be performed to form additional epi semiconductor material ("epi material") on the portions of the fins 106 in the source/drain regions of the device 100. At the point of processing depicted in FIG. 2, the gate structure (not shown in FIG. 2) and the gate cap (not shown in FIG. 2) will have been previously formed across the fins 106 and a sidewall spacer (not shown in FIG. 2) will have been formed adjacent the gate structure. It should be noted that the gate structure for the device disclosed herein may be formed by performing well-known gate first or replacement gate manufacturing techniques. Additionally, various doped regions, e.g., halo implant regions, doped source/drain regions, well regions and the like, are not depicted in the attached drawings. The FinFET device 100 depicted herein may be either an NMOS or a PMOS transistor. The various components and structures of the device disclosed herein may be formed using a variety of different materials and by performing a variety of known techniques, e.g., a chemical vapor deposition (CVD) process, an atomic layer deposition (ALD) process, a thermal growth process, spin-coating techniques, epi growth processes, etc. The thicknesses of these various layers of material may also vary depending upon the particular application.

With continuing reference to FIG. 2, in the example depicted herein, the FinFET device 100 will be depicted as comprising two illustrative fins 106. Of course, the device 100 may be comprised of more than the two illustrative fins 106 depicted herein. The fins 106 were formed by performing one or more etching processes, e.g., anisotropic etching processes, through a patterned fin-formation etch mask 104 to form a plurality of fin-formation trenches 105 in the substrate 102 and thereby define the plurality of fins 106. The patterned fin-formation etch mask 104 is intended to be representative in nature as it may be comprised of multiple layers of material, such as, for example, the depicted silicon dioxide layer 104A and the silicon nitride layer 104B. Thus, the particular form and composition of the patterned fin-formation etch mask 104 should not be considered a limitation of the presently disclosed inventions. The lateral width and vertical height of the fins 106 may vary depending upon the particular application. Additionally, the overall size, shape and configuration of the fin-formation trenches 105 and the fins 106 may vary depending on the particular application. In the illustrative examples depicted in the attached drawings, the fin-formation trenches 105 and the fins 106 are all depicted as having a uniform size and shape. However, such uniformity in the size and shape of the trenches 105 and the fins 106 is not required to practice at least some aspects of the inventions disclosed herein. In the attached figures, the fin-formation trenches 105 are depicted as having been formed by performing an anisotropic etching process that results in the fins 106 having a schematically (and simplistically) depicted, generally rectangular configuration. In an actual real-world device, the sidewalls of the fins 106 may be somewhat outwardly tapered (i.e., the fins may be wider at the bottom of the fin than they are at the top of the fin) although that configuration is not depicted in the attached drawings. Thus, the size and configuration of the fin-formation trenches 105 and the fins 106, and the manner in which they are made, should not be considered a limitation of the presently disclosed inventions. For ease of disclosure, only the substantially rectangular trenches 105 and fins 106 will be depicted in the subsequent drawings.

Figure 3:
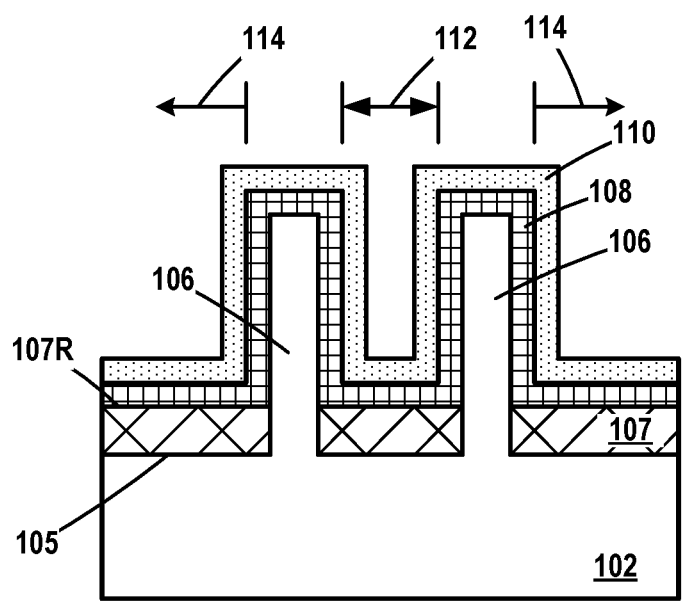

FIG. 3 depicts the device 100 after several process operations were performed.

First, a layer of insulating material 107, e.g., silicon dioxide, was blanket-deposited so as to overfill the trenches 105. In one illustrative process flow, as initially deposited, the layer of insulating material 107 also covers the patterned fin-formation etch mask 104. Thus, a chemical mechanical polishing (CMP) process that stops on the patterned fin-formation etch mask 104 was performed to planarize the upper surface of the layer of insulating material 107 and thereby expose the patterned fin-formation etch mask 104. At that point, an etching process was performed to remove at least the silicon nitride layer 104B of the patterned fin-formation etch mask 104. Next, a timed recess etching process was performed on the layer of insulating material 107 such that it has a recessed upper surface 107R that exposes the desired vertical height of the fins 106. The silicon dioxide layer 104A of the patterned fin-formation etch mask 104 was also removed during the recess etching process performed on the layer of insulating material 107.

Still referencing FIG. 3, a conformal deposition process, e.g., a conformal ALD process, was then performed to form a conformal layer of spacer material 108 around the fins 106 and above the recessed layer of insulating material 107. Thereafter, another conformal deposition process was performed to form a conformal protection layer 110 on the conformal layer of spacer material 108. The thickness and material of construction for the layers of material 108, 110 may vary depending upon the particular application. In general, the layers 108, 110 should be made of different materials that exhibit some degree of etch selectivity to one another when exposed to a common etching process. For example, the layer of spacer material 108 may be comprised of silicon nitride, silicon dioxide, SiNC, SiN, SiCO, and SiNOC, a low-k material (k value of 8 or less), as well as any multiple layer combination of insulating materials including, but not limited to, those previously identified, etc., while the conformal protection layer 110 may be comprised of another of those materials. In one particularly illustrative embodiment, the conformal layer of spacer material 108 may be comprised of SiCN and the conformal protection layer 100 may be comprised of silicon dioxide. The conformal layers of material 108, 110 may be formed to any desired thickness (e.g., 7-9 nm), but the layers 108, 110 need not be formed to the same thickness, although that may be the case in some application. With continuing reference to FIG. 3, it should be noted that the lateral spacing 112 between the portions of the conformal layer of spacer material 108 is a relatively confined spacing as compared to the area 114 positioned outward of the outer sidewalls of the fins 106. The magnitude of the lateral spacing 112 may vary depending upon the particular application and based upon a variety of factors, such as the pitch of the fins 106 as well as the thicknesses selected for the conformal layers of material 108, 110. In one particular example, the lateral spacing 112 may be about 20-28 nm.

Figure 4:
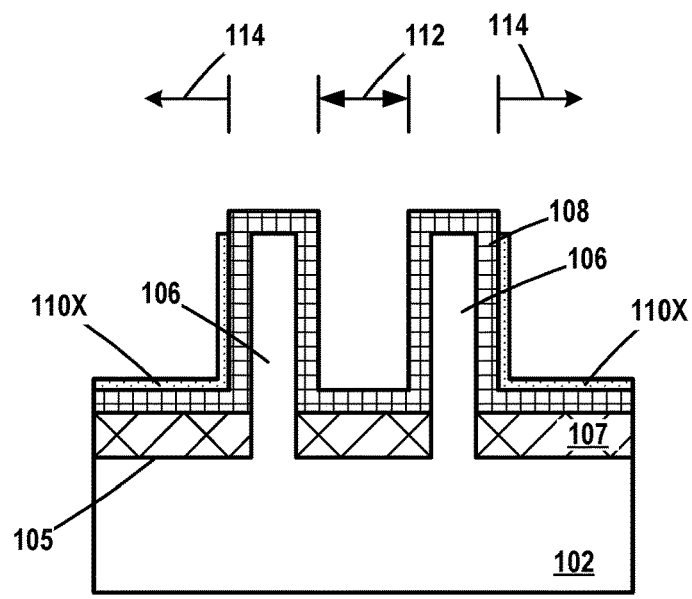

FIG. 4 depicts the device 100 after an anisotropic etching process was performed to remove portions of the conformal protection layer 110 relative to the conformal layer of spacer material 108. Due to the relatively confined lateral spacing 112, the etching process is more effective at removing the portion of the conformal protection layer 110 positioned in the confined space between the fins 106 as compared to the effectiveness of the spacer etching process in the less restrictive areas 114 outward of the fins 106. The etching process is timed such that substantially all of the conformal protection layer 110 located between the fins 106 is removed, while residual portions 110X of the conformal protection layer 110 remain positioned on the conformal layer of spacer material 108 at locations outward of the fins 106. The thickness of the residual portions 110X of the conformal protection layer 110 may vary depending upon the particular application. In one illustrative example, the residual portions 110X may have a thickness that is about 20-50% of the initial thickness of the conformal protection layer 110. It should be noted that, in the case where the device 100 may comprise a greater number of fins 106, for example, five fins 106, the etching process would remove substantially all of the conformal protection layer 110 in the spaces between adjacent fins, while the residual portions 110X of the conformal protection layer 110 would be positioned outward of only the outermost of the five fins 106.

Figure 5:
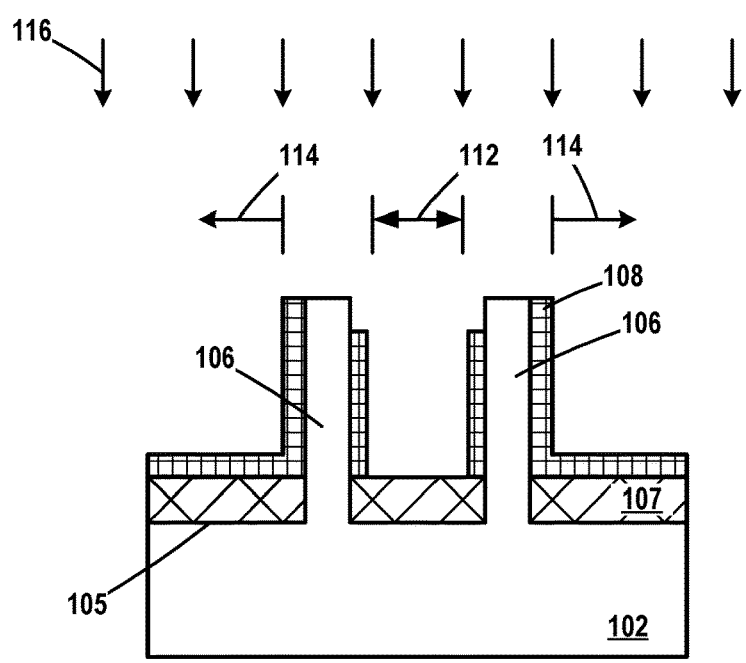
Figure 6:
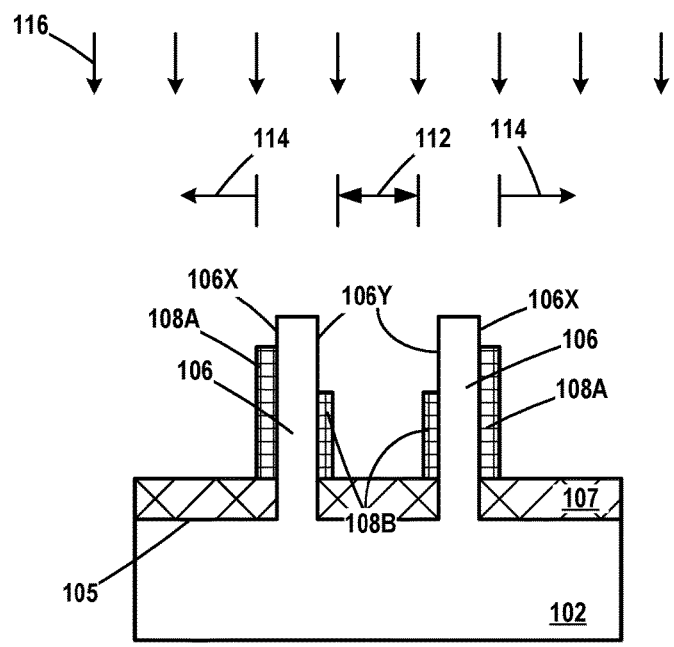

FIGS. 5 and 6 depict a sequence in which an anisotropic etching process 116 was performed to form sidewall spacers from the conformal layer of spacer material 108. Although the conformal layer of spacer material 108 and the conformal protection layer 110 are made from materials that exhibit some degree of etch selectivity relative to one another, the etch selectivity is not absolute. That is, when performing an etching process that is designed to primarily remove the material of the conformal layer of spacer material 108, such as the etching process 116, the remaining portions of the conformal protection layer 110 exposed to the etching process 116 will also be etched away, but at a much slower rate than the rate at which the material of the conformal layer of spacer material 108 is removed. Thus, FIG. 5 depicts the product at a point during the etching process 116 wherein substantially horizontally oriented portions of the conformal layer of spacer material 108 above the fins 106 and between the fins 106 have been removed, and the remaining portions 110X of the conformal protection layer 110 (see FIG. 4) have been removed from above the conformal layer of spacer material 108 in the areas 114 outward of the fins 106. That is, at the point of processing depicted in FIG. 5, the portions of the conformal layer of spacer material 108 positioned outward of the fins 106 has substantially the same thickness as they did when they were covered by the residual portions 110X of the conformal protection layer 110.

FIG. 6 depicts the device 100 at the completion of the spacer etching process 116. During this portion of the etching process 116, the remaining substantially horizontally oriented portions of the conformal layer of spacer material 108 are removed, as well as additional portions of the remaining portions of the conformal layer of spacer material 108 positioned between the fins 106. At the end of the etching process 116, a relatively taller sidewall spacer 108A is formed adjacent an outward sidewall 106X of each of the fins 106, while a relatively shorter sidewall spacer 108B is formed adjacent the inner or facing sidewalls 106Y of the fins 106. The difference in height between the spacers 108A and 108B may vary depending upon the particular application. In one illustrative example, the shorter spacers 108B may be about 50-75% of the height of the taller spacer 108A. As a result of the formation of the taller spacer 108A and the relatively shorter spacer 108B adjacent each of the fins 106, a greater vertical extent of the inner or facing sidewalls 106Y of the fins 106 is exposed as compared to the exposed vertical extent of the outer sidewalls 106X of the fins 106.

Figure 7:
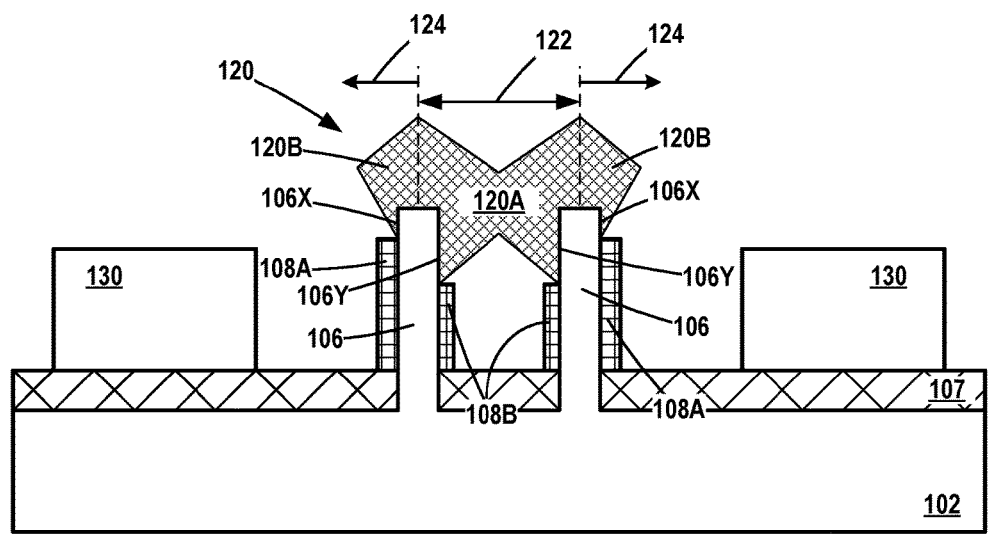

FIG. 7 depicts the device 100 after an epi semiconductor material 120 was formed on the exposed portions of the fins 106 by performing an epitaxial growth process. Due to the fact that more of the inner or facing sidewalls 106Y of the fins 106 are exposed as compared to the extent of the outer sidewalls 106X during this epi growth process, the epi material 120 does not form uniformly on each side of each fin 106. Rather, the epi material is formed asymmetrically on the fins 106 with a greater amount of the epi material 120 being formed on the inward side of the fins 106 as compared to the amount of epi material 120 formed on the outward side of the fins 106. More specifically, the portion 120A of the epi material 120 that is formed in the area 122 between the fins 106 is a greater amount or quantity as compared to the portions 120B (considered collectively) that are formed outward of the fins 106 in the areas 124. As depicted, the epi material 120 effectively merges together in the area 122.

As will be appreciated by those skilled in the art after a complete reading of the present application, the asymmetrical formation of the epi material 120 in the source/drain regions of the device 100 is beneficial for several reasons as compared to traditional prior art techniques that involve the approximate symmetrical formation of such epi semiconductor material in the source/drain regions of a FinFET device. For example, by forming more of the epi material 120 inward of the fins 106, the overall footprint of the device 100 may be reduced as compared to the footprint of the device if the epi material was formed in a symmetrical fashion, thereby leading to increased packing densities. FIG. 7 schematically depicts two illustrative FinFET devices 130 (that are of an opposite type to the device 100) formed on the substrate 102 adjacent the device 100. Using the asymmetrical epi formation techniques disclosed herein, there is less of the epi material formed in the areas 124 between the device 100 and the devices 130 as compared to situation if the epi material on the device 100 was formed in a symmetrical fashion. As a result, using the asymmetrical epi formation techniques disclosed herein, there is less of a chance of the epi material for the device 100 undesirably merging or shorting with the epi material (not shown) on the adjacent opposite type devices 130. Such an undesirable merger or short between such devices would likely lead to complete device failure for both devices. Other advantages may become apparent to those skilled in the art after a complete reading of the present application.

Figure 8:
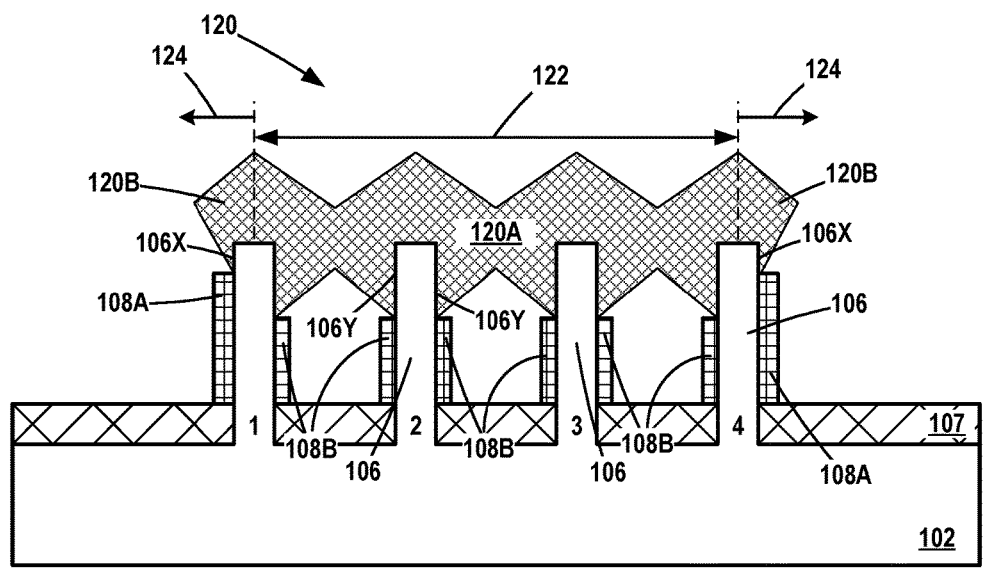

FIG. 8 depicts an embodiment of the device that comprises four illustrative fins 106 (numbered 1-4 for reference purposes). In this embodiment, by performing the methods disclosed herein, fins 2 and 3 have the relatively shorter spacers 108B formed adjacent both of the sidewalls of each of the fins 106, while the outer fins—fins 1 and 4—have a relatively taller spacer 108A formed on the outward sidewall 106X of the fin and a relatively shorter spacer 108B formed on the inward sidewall 106Y of the fin. As depicted, the formation of the epi material 120 is still asymmetrical in nature in that the epi material 120 does not form uniformly on each side of each of the four fins 106 of the illustrative device shown in FIG. 8. Rather, considered collectively, the epi material 120 is formed asymmetrically on at least fins 1 and 4 with a greater amount of the epi material 120 being formed on the fins 1 and 4 in the area 122 as compared to the portions 120B (considered collectively) of the epi material that is formed outward of fins 1 and 4 in the areas 124. As depicted, the epi material 120 effectively merges together in the area 122.

Thus, as will be appreciated by those skilled in the art after a complete reading of the present application, when considering a single fin 106, the methods disclosed herein enable the asymmetric formation of epi semiconductor material 120 on the fin 106 by virtue of formation of a first relatively taller spacer 108A on a first sidewall 106X of the fin 106 and the formation of second relatively shorter sidewall spacer 108B on a second sidewall 106Y of the fin 106 that is opposite the first sidewall 106X. Accordingly, a larger quantity of epi semiconductor material 120A is formed adjacent the second sidewall 106Y of the fin as compared to the amount of epi semiconductor material 120B formed adjacent the sidewall 106X of the fin 106.

When considering a FinFET device comprised of a plurality of fins 106, each of the outermost fins of the plurality of fins 106 have a first relatively taller spacer 108A on a first outward facing sidewall 106X of the fin 106 and a second relatively shorter sidewall spacer 108B on a second inward facing sidewall 106Y of the fin 106, wherein the second inward facing sidewall 106Y is positioned opposite the first outward facing sidewall 106X. Accordingly, a larger quantity of epi semiconductor material 120A is formed adjacent the second inward facing sidewall 106Y of the fin as compared to the amount of epi semiconductor material 120B formed adjacent the first outward facing sidewall 106X of each of the outermost fins 106 of the plurality of fins 106.

Figure 9:
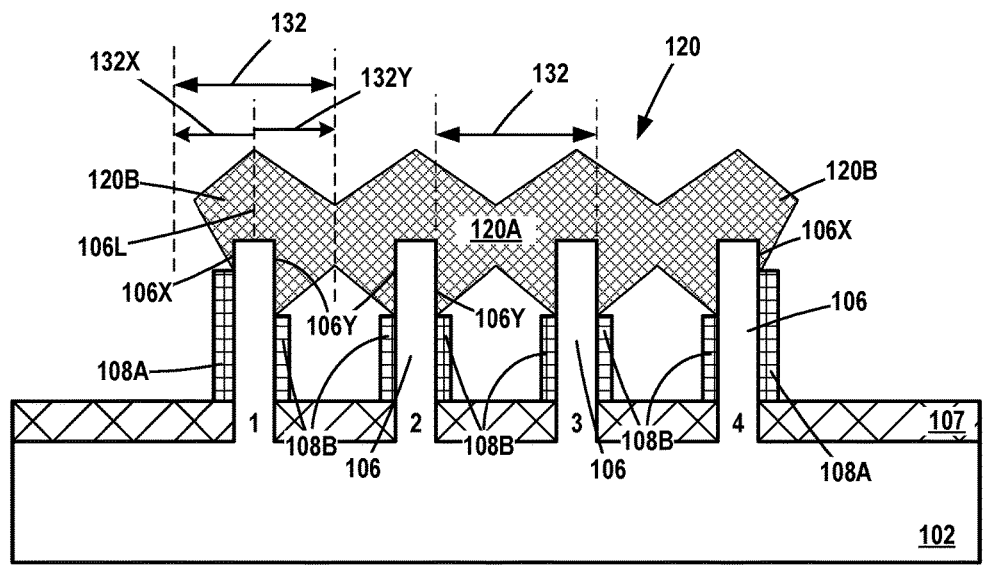

FIG. 9 is a duplicate of FIG. 8 with additional information added to explain various aspects of the various inventions disclosed herein. As shown in FIG. 9, the fins 106 are formed with a given fin pitch 132. The magnitude of the fin pitch 132 may vary depending upon the particular application. FIG. 9 depicts a lateral distance (in the gate width direction of the device 100) corresponding to the fin pitch 132 that is centered on an axial centerline 106L of fin number 1. The distances 132X and 132Y, each of which extends from the centerline 106L, correspond to one-half of the fin pitch 132. As will be appreciated by those skilled in the art, a volume of the epi material 120 will be formed along the axial length of the fins 106 in the source/drain regions of the device 100. The volume will approximately be defined by the cross-sectional area of the epi material 120 and the depth the epi material 120 extends into and out of the drawing plane in FIG. 9. Using the methods disclosed herein, considering the epi material 120 formed within a volume defined in part by a lateral dimension corresponding to the fin pitch 132 that is centered on the axial centerline 106L of fin 1, a first quantity of the epi semiconductor material 120 that extends from the centerline 106L toward the first sidewall 106X (i.e., to the left of the centerline 106L) of the fin is less than a second quantity of the epi semiconductor material 120 that extends from the axial centerline 106L toward the second sidewall 106Y of the fin (i.e., to the right of the centerline 106L). This asymmetrical formation of the epi semiconductor material is the same for the other outermost fin—fin 4. The amount of epi material 120 formed on interior fins 2 and 3 is approximately symmetrical with respect to the centerlines of those fins.

Figure 10:
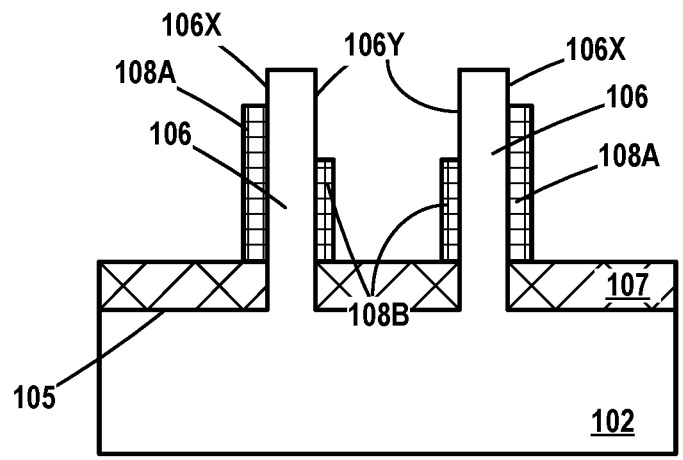
Figure 11:
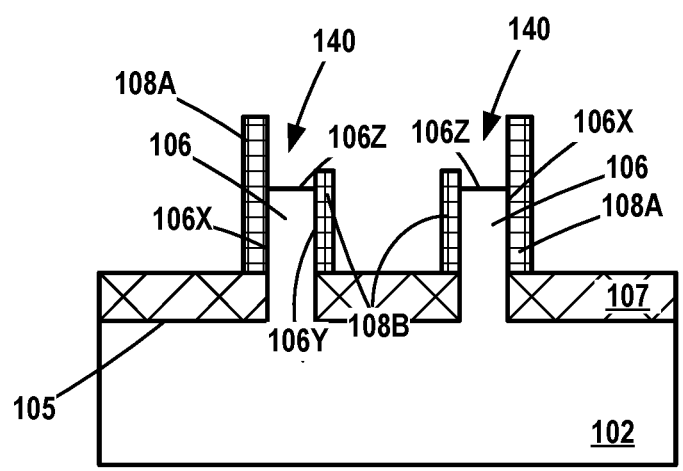
Figure 12:
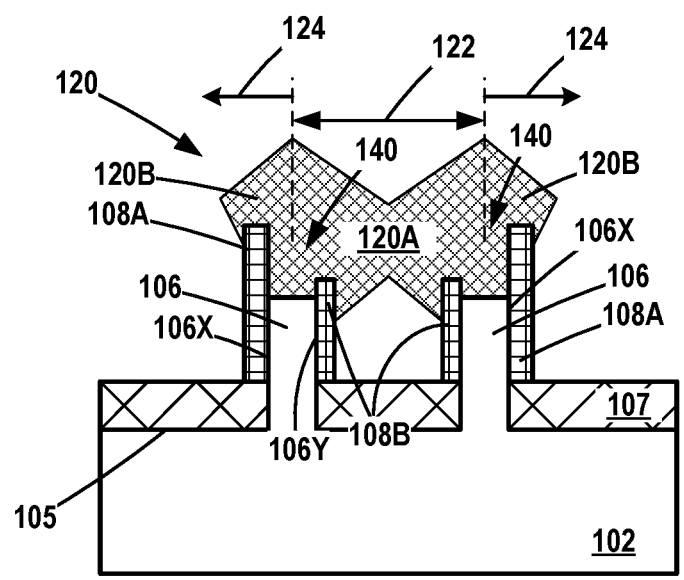

FIGS. 10-12 depict an alternative process flow to that described above. Basically, relative to the first embodiment disclosed above, after formation of the relatively taller sidewall spacers 108A and the relatively shorter sidewall spacers 108B, an etching process was performed to remove a portion of the vertical height of the fins 106, i.e., a cavity was formed in the fins 106. Accordingly, FIG. 10 depicts the device at a point in processing that corresponds to that shown in FIG. 6, i.e., after the formation of the relatively taller sidewall spacers 108A and the relatively shorter sidewall spacers 108B.

FIG. 11 depicts the device after an etching process was performed to remove a portion of the fins 106 and thereby define a fin cavity 140 along the axial length of the fin 106

(into and out of the plane of the drawing in FIG. 11) on opposite sides of the gate structure (not shown), i.e., in the source/drain regions of the device. As depicted, at the conclusion of the cavity etching process, the fin 106 has a recessed upper surface 106Z. The amount of such fin recessing (i.e., the depth of the fin cavities) may vary depending upon the particular application. In the example depicted herein, the fins 106 are recessed such that the upper surface 106Z (which is also the bottom surface of the fin cavities 140) is positioned below the upper surface of the relatively shorter sidewall spacers 108B.

FIG. 12 depicts the device 100 after the above-described epi semiconductor material 120 was formed in the fin cavities 140 in the fins 106 by performing an epitaxial growth process. As before, the epi material 120 is formed asymmetrically on the fins 106 with a greater amount of the epi material 120A being formed on the inward side of the fins 106 as compared to the amount of epi material 120B formed on the outward side of the fins 106. As was the case above, in this example, the portion 120A of the epi material 120 that is formed in the area 122 between the fins 106 is a greater amount or quantity as compared to the portions 120B (considered collectively) that are formed outward of the fins 106 in the areas 124. As depicted, the epi material 120 effectively merges together in the area 122. In this embodiment, the relatively taller sidewall spacers 108A tend to block the formation of the epi material 120 that tries to grow outwardly away from the outer sidewalls 106X of the fins 106, while the relatively shorter sidewall spacers 108B tend to allow more growth of epi material 120 inwardly of the inner sidewalls 106Y of the fins 106. The discussions above with respect to FIGS. 7-9 apply equally to this illustrative embodiment as well.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a fin for a FinFET device, said fin comprising first and second opposing sidewalls;
    forming a first sidewall spacer adjacent said first sidewall and a second sidewall spacer adjacent said second sidewall, said first sidewall spacer having a first height, said second sidewall spacer having a second height that is less than said first height; and
    forming an epitaxial semiconductor material on said fin and above said first and second sidewall spacers;
    wherein forming said first sidewall spacer adjacent said first sidewall and said second sidewall spacer adjacent said second sidewall comprises:
        forming a conformal layer of spacer material on said fin and adjacent said first and second sidewalls;
        forming a conformal protection layer on said conformal layer of spacer material;
        performing a first etching process to remove a portion of said conformal protection layer from above a first portion of said conformal layer of spacer material positioned adjacent said second sidewall while leaving a residual second portion of said conformal protection layer positioned above a second portion of said conformal layer of spacer material positioned adjacent said first sidewall; and
        performing a spacer etching process to remove portions of said conformal layer of spacer material and said residual second portion of said conformal protection layer so as to thereby result in the formation of said first sidewall spacer and said second sidewall spacer.

2. The method of claim 1, wherein said fin is formed on a fin pitch, and wherein, within a volume defined in part by a distance corresponding to said fin pitch that is centered on an axial centerline of said fin, a first quantity of said epi semiconductor material that extends from said axial centerline toward said first sidewall is less than a second quantity of said epi semiconductor material that extends from said axial centerline toward said second sidewall.

3. The method of claim 1, wherein said conformal layer of spacer material comprises SiCN and said conformal protection layer comprises silicon dioxide.

4. The method of claim 1, wherein a portion of said first sidewall is exposed above said first sidewall spacer, a portion of said second sidewall is exposed above said second sidewall spacer and wherein forming said epitaxial semiconductor material comprises forming said epitaxial semiconductor material on at least said exposed portion of said first sidewall above said first sidewall spacer and on at least said exposed portion of said second sidewall above said second sidewall spacer.

5. The method of claim 1, wherein, prior to forming said epitaxial semiconductor material, the method comprises performing a recess etching process on said fin to remove a vertical portion of said fin and form a fin cavity in said fin and wherein forming said epitaxial semiconductor material comprises forming said epitaxial semiconductor material in at least said fin cavity.

6. The method of claim 5, wherein a bottom surface of said fin cavity is positioned at a level that is below a level of an upper surface of said second sidewall spacer.

7. A method, comprising:
    forming a plurality of fins for a FinFET device, each of said plurality of fins comprising first and second opposing sidewalls, said plurality of fins comprising first and second outermost fins and at least one intermediate fin positioned between said first and second outermost fins;
    for at least each of said first and second outermost fins, forming a first sidewall spacer adjacent said first sidewall of said first and second outermost fins and a second sidewall spacer adjacent said second sidewall of said first and second outermost fins, said first sidewall spacer of said first and second outermost fins having a first height, said second sidewall spacer of said first and second outermost fins having a second height that is less than said first height;
    for said at least one intermediate fin, forming a first sidewall spacer adjacent said first sidewall of said at least one intermediate fin and a second sidewall spacer adjacent said second sidewall of said at least one intermediate fin, said first and second sidewall spacers of said at least one intermediate fin having said second height; and forming an epitaxial semiconductor material on at least each of said first and second outermost fins and above said first and second sidewall spacers on at least each of said first and second outermost fins.

8. The method of claim 7, wherein said plurality of fins consists of two fins.

9. The method of claim 7, wherein said plurality of fins comprises at least two fins.

10. The method of claim 7, wherein said plurality of fins are formed on a fin pitch, and wherein, within a volume defined in part by a distance corresponding to said fin pitch that is centered on an axial centerline of each of said first and second outermost fins, for each of said first and second outermost fins, a first quantity of said epi semiconductor material that extends from said axial centerline toward said first sidewall is less than a second quantity of said epi semiconductor material that extends from said axial centerline toward said second sidewall.

11. The method of claim 7, wherein, for each of said plurality of fins, a portion of said first sidewall is exposed above said first sidewall spacer and a portion of said second sidewall is exposed above said second sidewall spacer and wherein forming said epitaxial semiconductor material comprises forming said epitaxial semiconductor material on at least said exposed portion of said first sidewall above said first sidewall spacer and on said exposed portion of said second sidewall above said second spacer for at least each of said first and second outermost fins.

12. The method of claim 7, wherein, prior to forming said epitaxial semiconductor material, the method comprises performing a recess etching process on each of said plurality of fins to remove a vertical portion of each of said plurality of fins and form a fin cavity in each of said plurality of fins and wherein forming said epitaxial semiconductor material comprises forming said epitaxial semiconductor material in at least said fin cavity in each of said plurality of fins.

13. The method of claim 7, wherein forming said first sidewall spacer adjacent said first sidewall and said second sidewall spacer adjacent said second sidewall comprises:

forming a conformal layer of spacer material on said plurality of fins and adjacent said first and second sidewalls of each of said plurality of fins;

forming a conformal protection layer on said conformal layer of spacer material;

for each of said first and second outermost fins, performing a first etching process to remove a portion of said conformal protection layer from above a first portion of said conformal layer of spacer material positioned adjacent said second sidewall while leaving a residual second portion of said conformal protection layer positioned above a second portion of said conformal layer of spacer material positioned adjacent said first sidewall; and performing a spacer etching process to remove portions of said conformal layer of spacer material and said residual second portion of said conformal protection layer so as to thereby result in the formation of said first sidewall spacer and said second sidewall spacer positioned adjacent each of said first and second outermost fins.

14. A FinFET device, comprising:

a plurality of fins comprising first and second outermost fins and at least one intermediate fin positioned between said first and second outermost fins, said plurality of fins comprising first and second opposing sidewalls;

for at least each of said first and second outermost fins, a first sidewall spacer positioned adjacent said first sidewall of said first and second outermost fins and a second sidewall spacer positioned adjacent said second sidewall of said first and second outermost fins, said first sidewall spacer of said first and second outermost fins having a first height, said second sidewall spacer of said first and second outermost fins having a second height that is less than said first height, a portion of said first sidewall being exposed above said first sidewall spacer of said first and second outermost fins, and a portion of said second sidewall of said first and second outermost fins being exposed above said second sidewall spacer;

for said at least one intermediate fin, a first sidewall spacer adjacent said first sidewall of said at least one intermediate fin and a second sidewall spacer adjacent said second sidewall of said at least one intermediate fin, said first and second sidewall spacers of said at least one intermediate fin having said second height; and an epitaxial semiconductor material on said plurality of fins and above said first and second sidewall spacers of said plurality of fins.

15. The FinFET device of claim 14, wherein said second height is approximately 50-75% of said first height.

16. The FinFET device of claim 14, wherein said epitaxial semiconductor material is positioned on a portion of said first sidewall above said first sidewall spacer and on a portion of said second sidewall above said second sidewall spacer.

17. The FinFET device of claim 14, wherein said plurality of fins are formed on a fin pitch, and wherein, within a volume defined in part by a distance corresponding to said fin pitch that is centered on an axial centerline of each of said first and second outermost fins, a first quantity of said epi semiconductor material extends from said axial centerline toward said first sidewall is less than a second quantity of said epi semiconductor material that extends from said axial centerline toward said second sidewall.

\* \* \* \* \*